United States Patent
Bellur et al.

(10) Patent No.: US 8,446,188 B2
(45) Date of Patent: May 21, 2013

(54) SYSTEMS AND METHODS FOR PRODUCING A PREDETERMINED OUTPUT IN A SEQUENTIAL CIRCUIT DURING POWER ON

(75) Inventors: Kashyap R. Bellur, San Diego, CA (US); Anosh B. Davierwalla, San Diego, CA (US); Christian Holenstein, San Diego, CA (US)

(73) Assignee: QUALCOMM, Incorporated, San Diego, CA (US)

( * ) Notice: Subject to any disclaimer, the term of this patent is extended or adjusted under 35 U.S.C. 154(b) by 238 days.

(21) Appl. No.: 12/762,992

(22) Filed: Apr. 19, 2010

(65) Prior Publication Data

US 2010/0289537 A1 Nov. 18, 2010

Related U.S. Application Data

(60) Provisional application No. 61/178,839, filed on May 15, 2009.

(51) Int. Cl.
*H03L 7/00* (2006.01)

(52) U.S. Cl.
USPC .......................................... 327/143

(58) Field of Classification Search
None
See application file for complete search history.

(56) References Cited

U.S. PATENT DOCUMENTS

| 6,259,299 | B1 | 7/2001 | Ryu |
| 6,731,151 | B1 | 5/2004 | Doutreloigne |
| 7,193,445 | B2 * | 3/2007 | Bertram ........................ 326/95 |
| 7,199,617 | B1 | 4/2007 | Schrom et al. |
| 7,397,296 | B1 * | 7/2008 | Kiani ............................. 327/333 |
| 2005/0082573 | A1 * | 4/2005 | Williford ....................... 257/202 |
| 2005/0285659 | A1 | 12/2005 | Kanno et al. |
| 2006/0001470 | A1 | 1/2006 | Owen |
| 2009/0108904 | A1 | 4/2009 | Shiffer, II |

OTHER PUBLICATIONS

International Search Report and Written Opinion—PCT/US2010/035084, International Search Authority—European Patent Office—Aug. 30, 2010.

* cited by examiner

*Primary Examiner* — Daniel Rojas
(74) *Attorney, Agent, or Firm* — William M. Hooks

(57) ABSTRACT

An integrated circuit configured for producing a predetermined output in a sequential circuit during power on is disclosed. The integrated circuit includes one or more capacitors coupled to one or more internal nodes. The one or more capacitors charge the internal nodes if a voltage at the power supply node ramps up to a set voltage at or faster than a period of time. The integrated circuit also includes a first transistor coupled to the power supply node. The first transistor produces leakage current that charges one or more internal nodes when the voltage on the power supply node ramps up to the set voltage no faster than the period of time. The integrated circuit also includes an output node. A logical value on the output node is based on a logical value on the charged internal nodes when an input signal to the sequential circuit is not active and the voltage on the power supply node is at the set voltage.

24 Claims, 14 Drawing Sheets

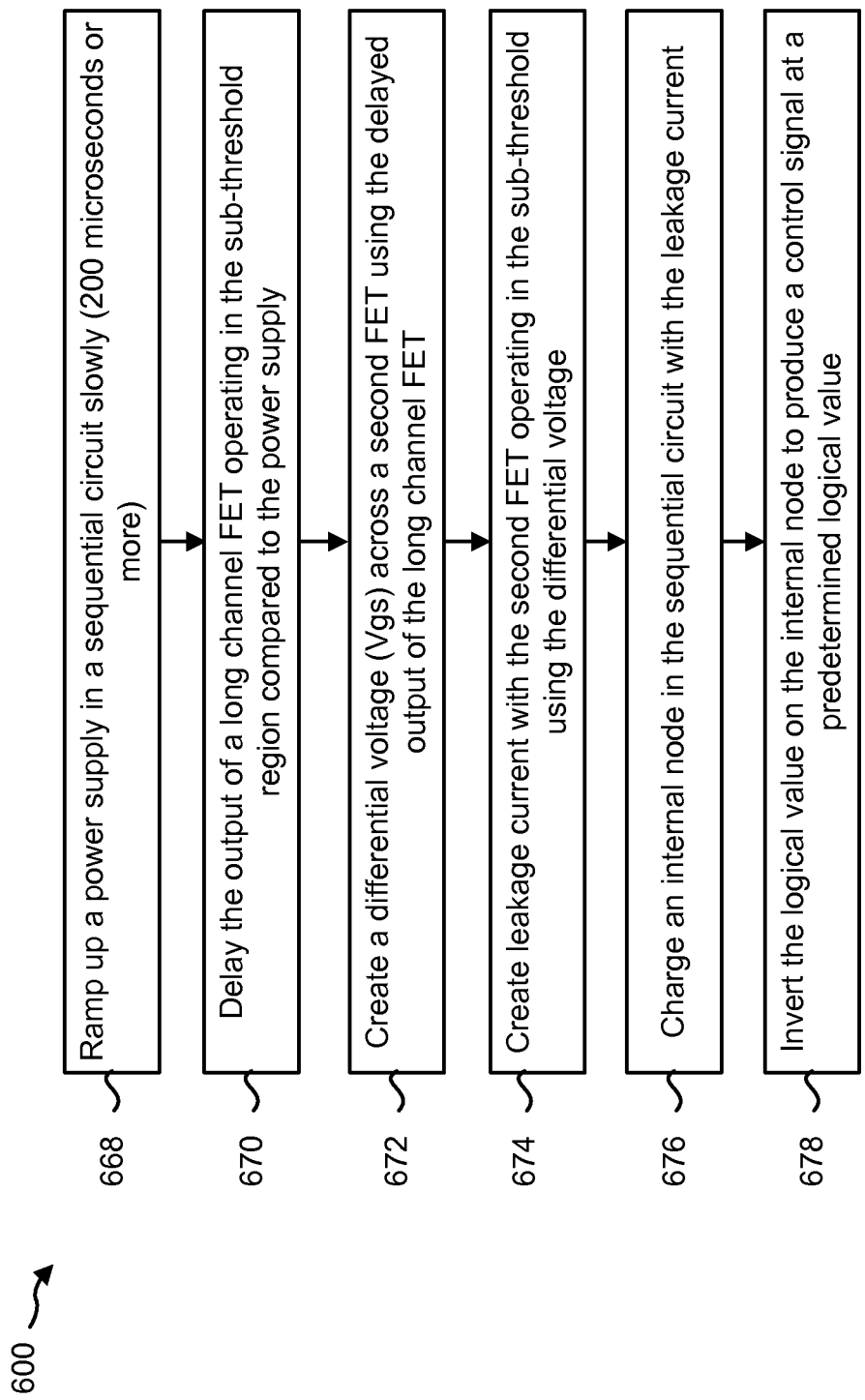

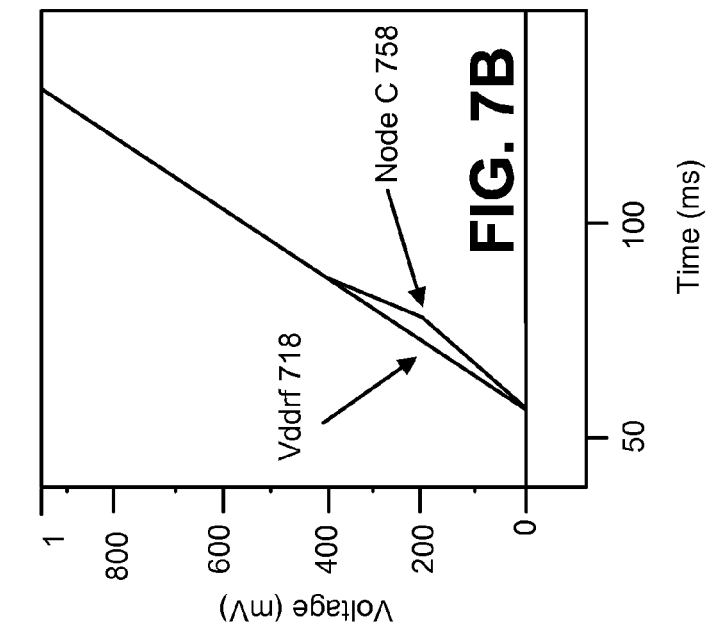
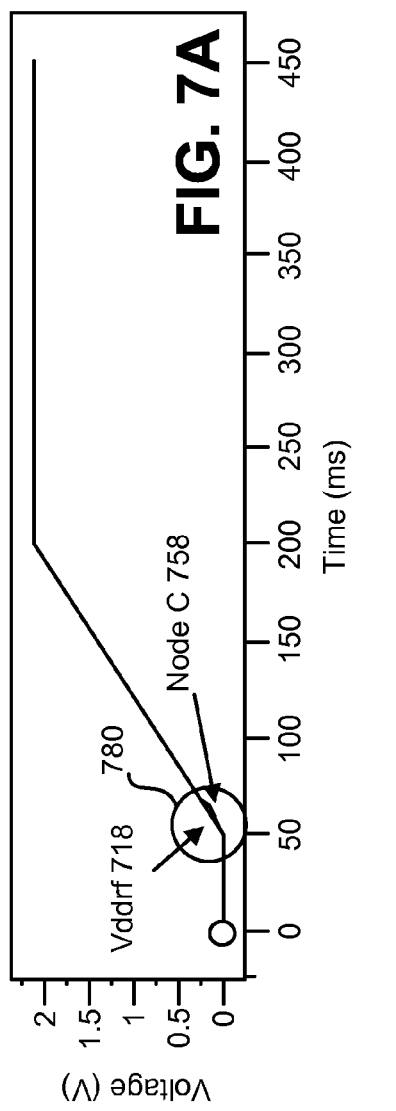
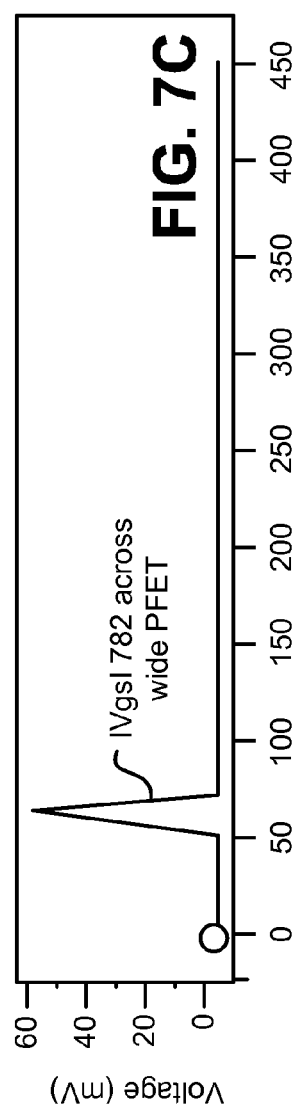
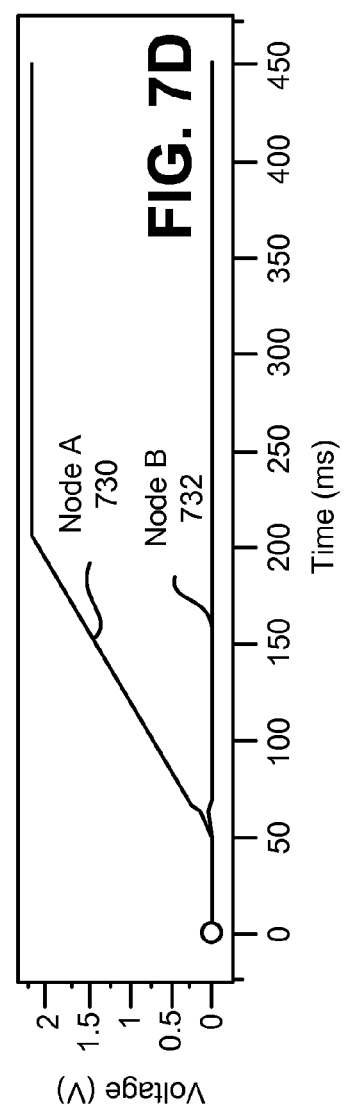

US 8,446,188 B2

SYSTEMS AND METHODS FOR PRODUCING A PREDETERMINED OUTPUT IN A SEQUENTIAL CIRCUIT DURING POWER ON

RELATED APPLICATIONS

This application is related to and claims priority from U.S. Provisional Patent Application Ser. No. 61/178,839 filed May 15, 2009, for "Systems and Methods for Producing a Predetermined Output in a Sequential Circuit During Power On," with inventors Kashyap R. Bellur, Anosh B. Davierwalla and Christian Holenstein.

TECHNICAL FIELD

The present disclosure relates generally to circuits. More specifically, the present disclosure relates to systems and methods for producing a predetermined output in a sequential circuit during power on.

BACKGROUND

Electronic devices are used widely today. Modern devices increase productivity, provide people with entertainment, and allow for conveniences previously unknown. For example, wireless communication systems have become an important means by which many people worldwide have come to communicate. One obvious advantage of wireless communication is the freedom to communicate without being plugged into a power supply. This freedom, however, requires that wireless devices, like many electronic devices, include their own mobile power source, such as a battery.

Furthermore, wireless devices continue to have more capabilities than ever before. In addition to making telephone calls, many devices now include LCD screens, high data rate capability, and speakerphone capability, all of which consume a large amount of power. Also, the size of wireless devices continues to shrink, leaving less space for batteries in wireless devices.

All of these factors combine to make power an important consideration in wireless devices. Although battery technology continues to advance, providing better power supplies in smaller spaces, it is still important to reduce power consumption in the operation of wireless devices whenever possible. Therefore, benefits may be realized by improved methods and apparatus related to the consumption of power in electronic devices, particularly wireless communication devices.

BRIEF DESCRIPTION OF THE DRAWINGS

FIG. 2 is a block diagram illustrating an integrated circuit for producing a predetermined output in a sequential circuit during power on;

FIG. 3 is a circuit diagram of a voltage level shifter for producing a predetermined output during fast ramping power on;

FIG. 4 is a flow diagram illustrating a method for producing a predetermined output during fast ramping power on;

FIG. 5 is a circuit diagram of a voltage level shifter for producing a predetermined output during slow ramping power on;

FIG. 6 is a flow diagram illustrating a method for producing a predetermined output during slow ramping power on;

FIGS. 7A-7D are waveforms illustrating characteristics of a voltage level shifter for producing a predetermined output during slow ramping power on;

FIG. 8 is a circuit diagram illustrating a level shifter for producing a predetermined output during power on;

FIG. 9 is a flow diagram illustrating a method for producing a predetermined output during power on;

DETAILED DESCRIPTION

Figure 1:
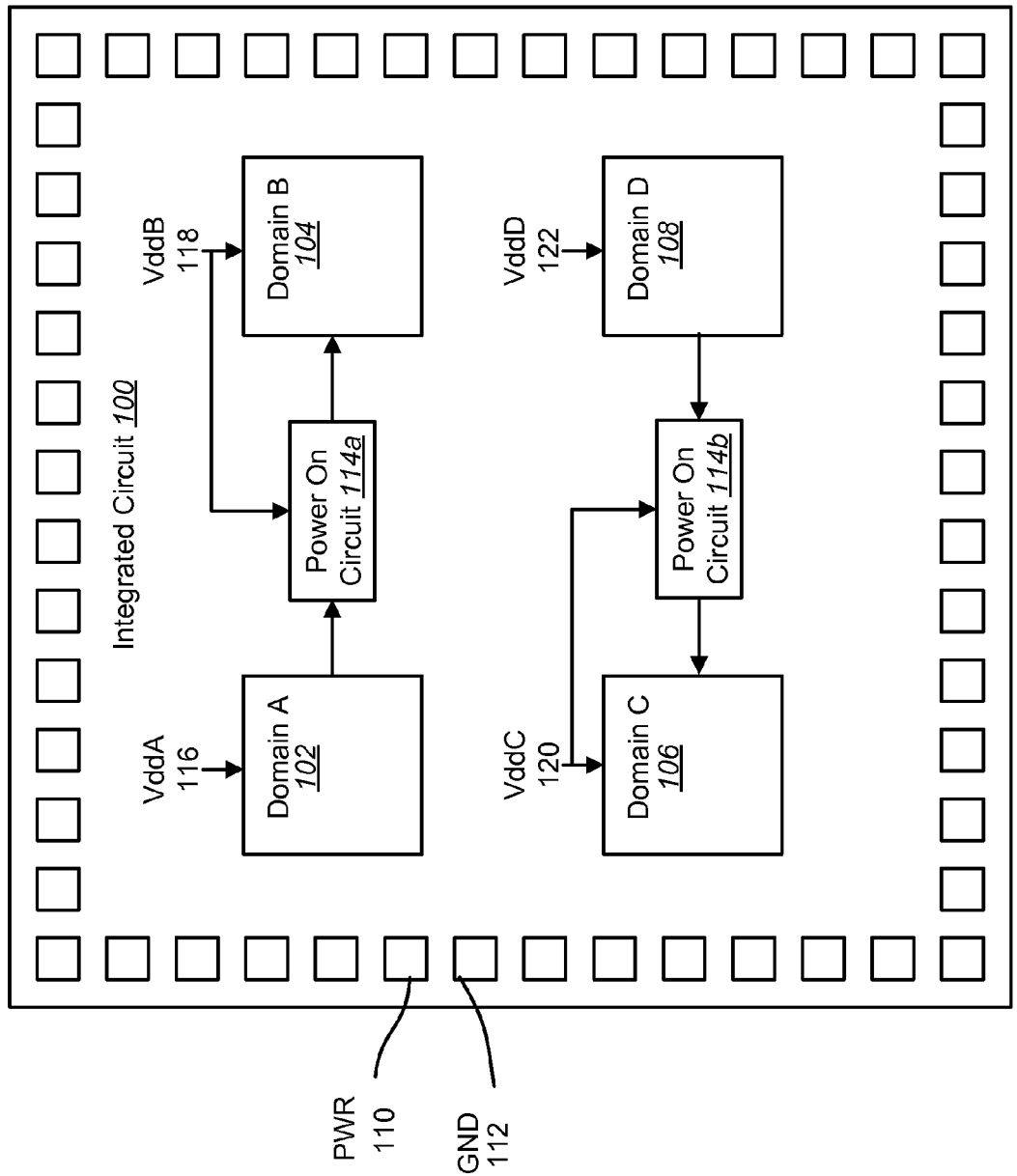
FIG. 1 is a block diagram of an integrated circuit die.

An integrated circuit configured for producing a predetermined output in a sequential circuit during power on is disclosed. The integrated circuit includes a power supply node. The integrated circuit also includes one or more capacitors coupled to one or more internal nodes. The capacitors charge the internal nodes if a voltage at the power supply node ramps up to a set voltage at or faster than a period of time. The integrated circuit also includes a first transistor coupled to the power supply node. The first transistor produces leakage current that charges one or more internal nodes when the voltage on the power supply node ramps up to the set voltage no faster than the period of time. The integrated circuit also includes an output node with a logical value that is based on the charged internal nodes when an input signal to the sequential circuit is not active and the voltage on the power supply node is at the set voltage.

In one configuration, the logical value on the output node may be the same as a logical value in the input signal when the input signal is active. The integrated circuit may also include a second transistor configured to create a differential voltage on the first transistor and the differential voltage may cause the first transistor to create the leakage current. The second transistor may be a long-channel P-channel field effect transistor (PFET). In one possible configuration, the set voltage may be between 2 and 2.5 volts, and the period of time may be 200 microseconds.

In another configuration, the integrated circuit may include an inverter coupled between one of the internal nodes and the output node and the inverter may invert the logical value on one of the internal nodes to produce the logical value on the output node. The one or more capacitors may include a first capacitor coupled between the power supply node and one of the internal nodes and a second capacitor coupled between a relative ground and one of the internal nodes. The first transistor may operate in the sub-threshold region.

A method for producing a predetermined output in a sequential circuit during power on is also disclosed. A power supply in a first domain is ramped up. Capacitive coupling is used to produce a predetermined output if the power supply ramps up to a set voltage at or faster than a period of time. Charge injection is used to produce a predetermined output if the power supply ramps up to the set voltage no faster than the period of time. A second power domain that controls the output of the sequential cells is powered on.

An apparatus for producing a predetermined output in a sequential circuit during power on is also disclosed. The apparatus includes means for ramping up a power supply in a first domain. The apparatus also includes means for using capacitive coupling to produce a predetermined output if the power supply ramps up to a set voltage at or faster than a period of time. The apparatus also includes means for using charge injection to produce a predetermined output if the power supply ramps up to the set voltage no faster than the period of time. The apparatus also includes means for powering on a second power domain that controls the output of the sequential circuit when the second power domain is powered on.

Integrated circuits may be arranged by domain. Each domain may include one or more sequential circuits or sequential cells that cumulatively perform a function. As used herein, the term "sequential circuit" or "sequential cell" refers to any circuit that holds either a 1 or a 0 value, i.e., a digital circuit. For example, an integrated circuit may have a core domain that includes decision making logic for the rest of the integrated circuit. Additionally, an integrated circuit may include a radio frequency (RF) domain for analog processing. The core domain may control which blocks in the RF domain are active in functional mode (both power domains "ON"). However, since the different domains may be powered on at different times, it may be important to ensure that certain control signals start at a predetermined state.

The present systems and methods employ a charge injection technique coupled with differential capacitive loading enabling a level shifter output to start out at logic "0" when the RF domain is turned on (the core domain being off). At fast transition times of the power domain, coupling capacitors may ensure that the level shifter outputs start in the right state. At slow transition times, a charge injection circuit enables the output of the level shifter to start off in logic state "0". In other words, during slow power supply ramp up, a tunable resistor and charge injection P-channel field effect transistor (PFET) may enable a deterministic output state of sequential cells. Together, the capacitive coupling and charge injection of the present systems and methods enable a deterministic output state of sequential cells across a range of ramp speeds, e.g., 5 microseconds to 1,000 microseconds.

FIG. 1 is a block diagram of an integrated circuit die 100. The integrated circuit die 100 may include a peripheral ring of bonding terminals and four domains of internal circuitry, domain A 102, domain B 104, domain C 106, and domain D 108. The integrated circuit 100 may include more or less than four domains. These domains are called power domains because the circuitry within each domain may be powered or unpowered separately from the other domains, e.g., domain B 104 may be powered on before domain A 102 according to a power on sequence.

The integrated circuit 100 may also include a power contact 110, terminal 110 or pin 110, and a ground contact 112, terminal 112 or pin 112, that may provide relative voltage levels to the domains. The power contact 110 may receive power from a battery or other source. The integrated circuit 100 may then propagate the power received at the power contact 110 to one or more domains. For example, domain A 102 may be the digital core of a chip and may operate using VddA 116 that is 1, 1.2, or 1.5 volts, while domain B 104 may be a radio frequency (RF) or analog domain that operates using VddB 118 that is 2, 2.1, or 2.5 volts. However, even though domain A 102 and domain B 104 may operate using different voltage levels, both domains may receive power from the power contact 110. Likewise, domain C 106 may operate using VddC 120 and domain D 108 may operate using VddD 122 where VddC 120 and VddD 122 are different from each other and from VddA 116 and VddB 118.

The integrated circuit 100 may also include one or more power on circuits 114. The power on circuit(s) 114 may be any sequential circuit for which a predetermined output at power on is desirable. For the following example, assume that the power on circuits 114 are voltage level shifters (VLS) that shift the voltage levels from a first level to a second level, and that the integrated circuit 100 is powered up in the following order: domain B 104, domain A 102, domain C 106, domain D 108. Further assume that the output of domain A 102 controls domain B 104 via the first power on circuit (first level shifter) 114a and domain D 108 controls domain C 106 via the second power on circuit (second level shifter) 114b. In other words, domain A 102 sends control signals to domain B 104 and domain D 108 sends control signals to domain C 106. During normal operation, (i.e., when all domains are powered on), the output of the first level shifter 114a may represent the output of domain A 102 shifted to an appropriate voltage level for domain B 104 and the output of the second level shifter 114b may represent the output of domain D 108 shifted to an appropriate voltage level for domain C 106. However, since domain B 104 and domain C 106 are powered on before domain A 102, and domain D 108, respectively, the first level shifter 114a and the second level shifter 114b may also be powered on, at least partially, before domain A 102, and domain D 108, respectively. Thus, if the first level shifter 114a powers on with a high signal before domain A 102 is powered on, one or more blocks in domain B 104 may be inadvertently powered on, which may dissipate power unnecessarily. Likewise, if the second level shifter 114b powers on with a high signal before domain D 108 is powered on, one or more blocks in domain C 106 may be inadvertently powered on, which may dissipate power unnecessarily.

Therefore, the power on circuits 114 may use capacitive coupling and/or charge injection to produce a predetermined output during power on. In other words, the power on circuits 114 may use deterministic initialization of sequential circuits during power supply ramp. For example, if VddB 118 and VddC 120 ramp up quickly, (i.e., less than 200 microseconds), the power on circuits 114 may use capacitive coupling to produce a predetermined output. If VddB 118 and VddC 120 ramp up slowly, (i.e., more than or equal to 200 microseconds), the power on circuits 114 may use charge injection to produce a predetermined output.

Figure 2:
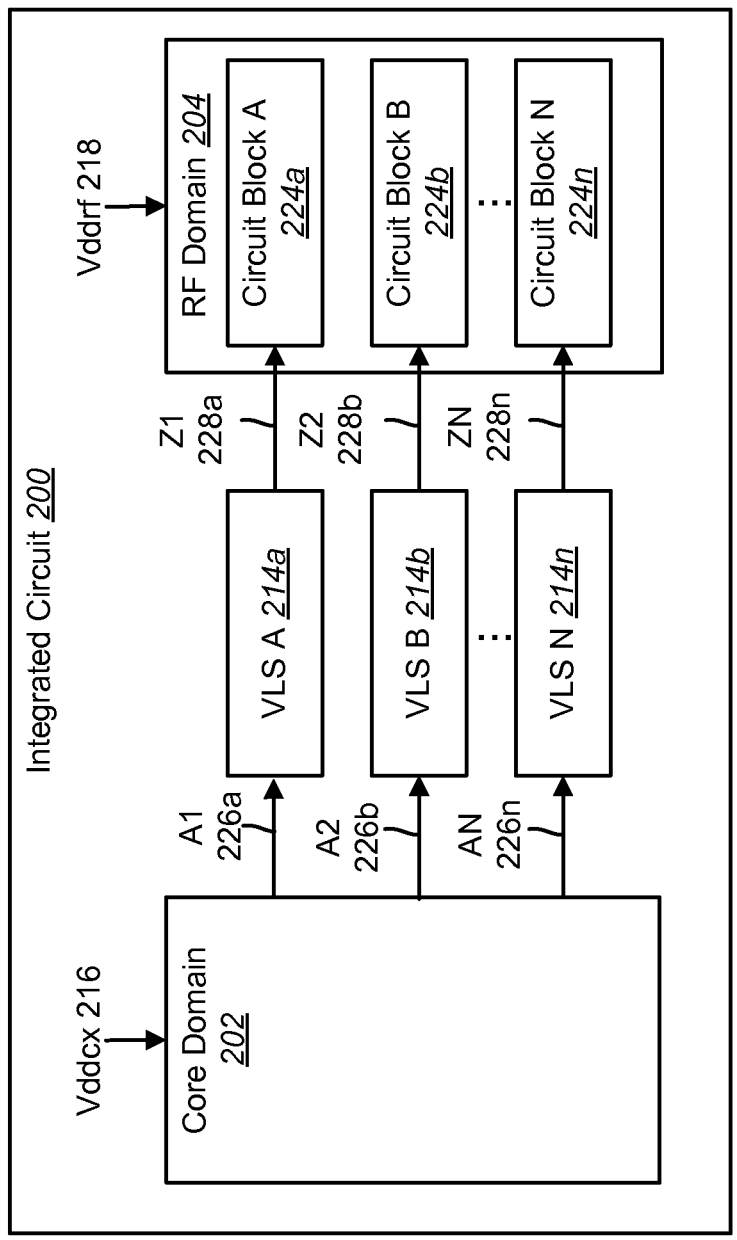

FIG. 2 is a block diagram illustrating an integrated circuit 200 for producing a predetermined output in a sequential circuit during power on. The integrated circuit 200 may include a core domain 202 and an RF domain 204. The core domain 202 may include digital circuits and may operate using a power supply of 1 to 1.5V, e.g., 1.2V. The RF domain 204 may include analog circuits and may operate using a higher power supply of 2 to 2.5V, e.g., 2.1V. During normal operation, (i.e., when both the core domain 202 and the RF domain 204 are powered on), one or more voltage level shifters (VLS) 214 may be used to shift up the output 226 of the core domain 202 before it is used as a control signal to the RF domain 204. In other words, the core domain 202 may output control signal A1 226a that is meant to control circuit block A 224a within the RF domain 204. Before A1 226a can be used by circuit block A 224a, it may be level shifted up by VLS A 214a to produce Z1 228a that is then used to control circuit block A 224a. Likewise, VLS B 214b may level shift A2 226b up to Z2 228b and VLS N 214n may level shift AN 226n up to ZN 228n. The signals Z2 228b and ZN 228n may then be used to control circuit block B 224b and circuit block N 224n, respectively. VLS A 214a, VLS B 214b, and VLS N 214n may be used to shift voltage levels up or down, depending on the needs of the integrated circuit 200.

Domains on the integrated circuit 200 that may be powered on according to a certain sequence. The VLSs 214 may be powered by both Vddcx 216 and Vddrf 218. Therefore, if the RF domain 204 and the VLSs 214 are powered on by Vddrf 218, (i.e., the RF supply) before the core domain 202, (i.e., the core supply) is powered on by Vddcx 216, no reliable control signal may be received from the core domain 202 until the core domain 202 is powered on. Even though the time between powering on the RF domain 204 and the core domain 202 may be relatively short, it may be long enough to inadvertently power on one or more circuit block 224 in the RF domain 204 that may result in wasted power. In other words, if the Vddrf 218 supply is powered before the Vddcx 216 supply, it may be desirable to prevent the RF domain 204 blocks from being activated. Therefore, the present systems and methods use capacitive coupling and charge injection to ensure that a sequential circuit, (e.g., a level translator) produces a predetermined value during power on. In the illustrated configuration, the VLSs 214 may use capacitive coupling and charge injection to ensure that the outputs, Z 228, are low so that none of the circuit blocks 224 are powered on inadvertently. Alternatively, VLSs 214 may use capacitive coupling and charge injection to ensure that the outputs, Z 228, are high. Additionally, while the configurations herein are described with voltage level shifters 214, the present systems and methods are equally applicable to any sequential circuit for which a predetermined output during power on is desirable.

Figure 3:
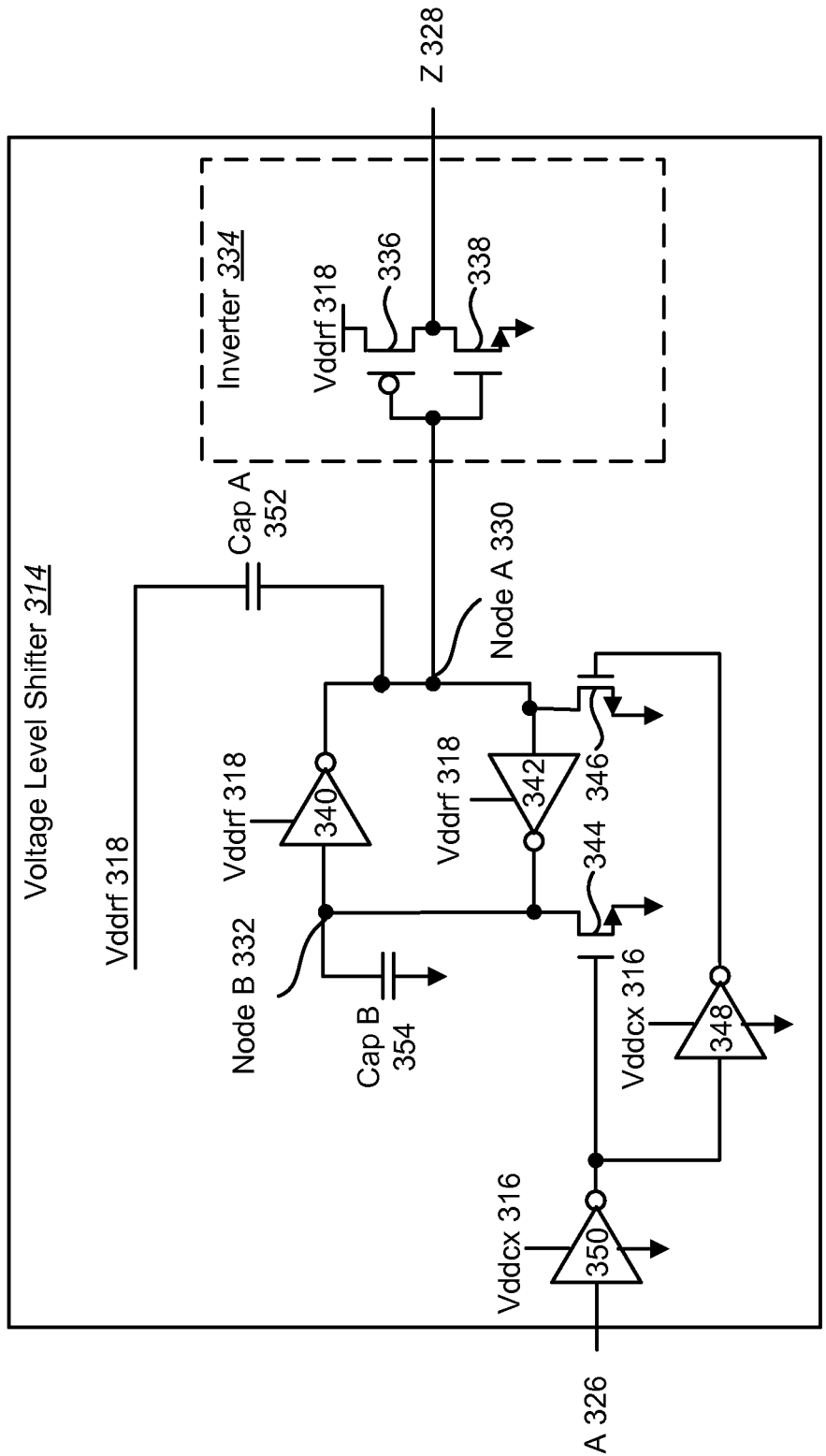

FIG. 3 is a circuit diagram of a voltage level shifter 314 for producing a predetermined output during fast ramping power on. The level shifter 314 may be powered by Vddrf 318 and Vddcx 316. The level shifter 314 may include cross coupled inverters 340, 342 with Node A 330 on one side and Node B 332 on the opposite side, allowing the level shifter 314 to hold either a high or low value. In other words, when Node A 330 is high, Node B 332 may be forced low. Likewise, when Node A 330 is low, Node B 332 may be forced high. An inverter 334 may include multiple transistors 336, 338 designed to invert the value of Node A 330. Therefore, when Node A 330 is low, Z 328 may be high and when Node A 330 is high, A 328 may be low. Although the inverter 334 is illustrated as a complementary metal oxide semiconductor (CMOS) inverter, any suitable inverter may be used. The level shifter 314 may also include other secondary inverters 348, 350 and/or secondary transistors 344, 346 designed to make Z 328 equal to A 326 during normal operation, i.e., both the core domain 202 and the RF domain 204 are powered on. Additionally, it should be noted that the ground voltage level may be a relative voltage level. In other words, ground may be implemented with another voltage level, e.g., Vssx.

During normal operation, the output of the level shifter 314, Z 328, may be logically equivalent to the level shifter 314 input, A 326. In other words, if A 326 is low, then Z 328 may also be low. Likewise, if A 326 is high, then Z 328 may also be high. However, if Vddrf 318 is powered on before Vddcx 316, according to a predetermined power on sequence or otherwise, Z 328 may be unpredictable until Vddcx 316 is powered on. This may result in Z 328 being high, which may inadvertently power on one or more circuit blocks 224 in the RF domain 204, thus wasting power.

Therefore, in order to produce a predetermined output, Z 328, during power on capacitive coupling may be used. Capacitor A 352 may be coupled between Vddrf 318 and Node A 330 and may ensure that once Vddrf 318 goes high, that Node A 330 also goes high. In response to Node A 330 going high, Z 328 may go low. In other words, capacitor A 352 couples Vddrf 318 to Node A 330 resulting in Z going to 0. Capacitor B 354 may be coupled between Node B 332 and ground and may ensure that Node B 332 is held low when Vddrf 318 ramps up. In other words, capacitor A 352 and capacitor B 354 ensure that Node A 330 and Node B 332 "wake up" at a predetermined value, i.e., capacitor A 352 and capacitor B 354 guard against metastability. Using capacitive coupling, the level shifter 314 may operate according to the following rules:

Vddrf=1; Vddcx=0:Z=0;
Vddrf=1; Vddcx=1:Z=A;

The present systems and methods may alternatively be used to ensure that Z 328 is high during fast ramping power on.

Figure 4:
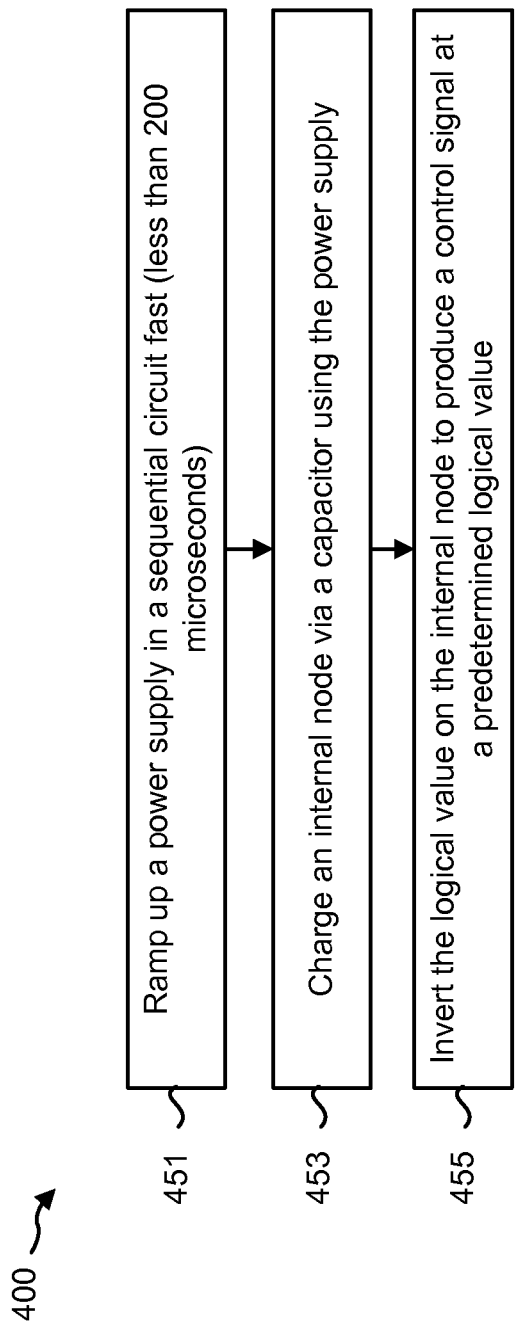

FIG. 4 is a flow diagram illustrating a method 400 for producing a predetermined output during fast ramping power on. The method 400 may be performed by the voltage level shifter 314 illustrated in FIG. 3. A power supply, (e.g., Vddrf 318), in a sequential circuit may ramp up 451 fast, i.e., less than 200 microseconds. The power supply may charge 453 an internal node via a capacitor. In other words, capacitor A 352 may be charged by Vddrf 318, and may then charge Node A 330. The logical value on the internal node may then be inverted 455 to produce a control signal at a predetermined logical value. In other words, the high value on Node A 330 may be inverted by the inverter 334 to force Z 328 to low.

Figure 4A:
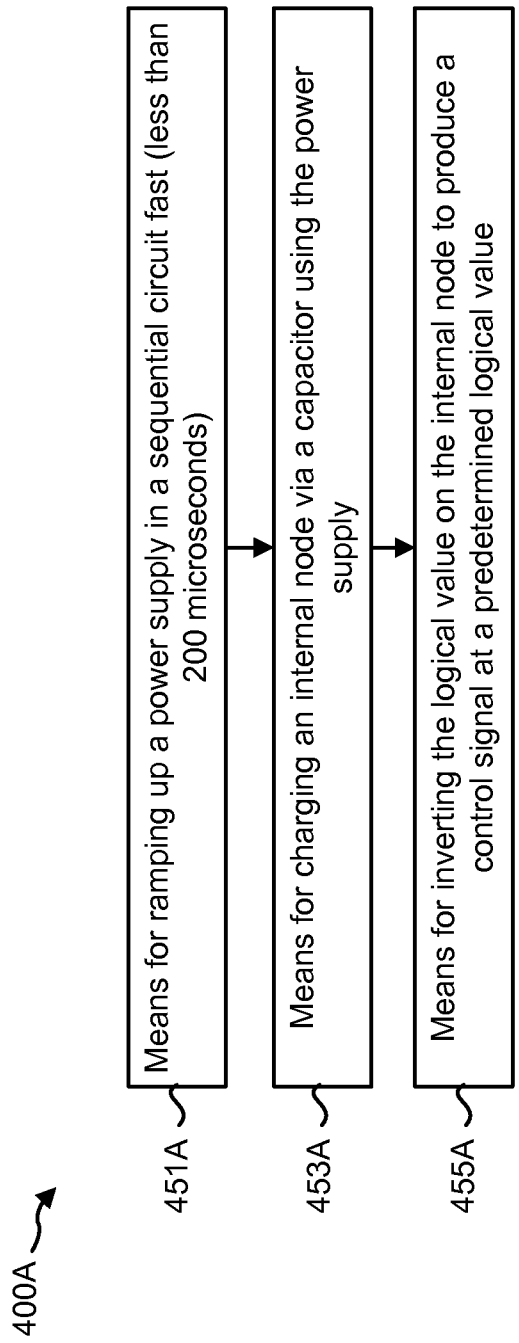
FIG. 4A illustrates means-plus-function blocks corresponding to the method of FIG. 4.

The method 400 of FIG. 4 described above may be performed by various hardware and/or software component(s) and/or module(s) corresponding to the means-plus-function blocks 400A illustrated in FIG. 4A. In other words, blocks 451 through 455 illustrated in FIG. 4 correspond to means-plus-function blocks 451A through 455A illustrated in FIG. 4A.

Figure 5:
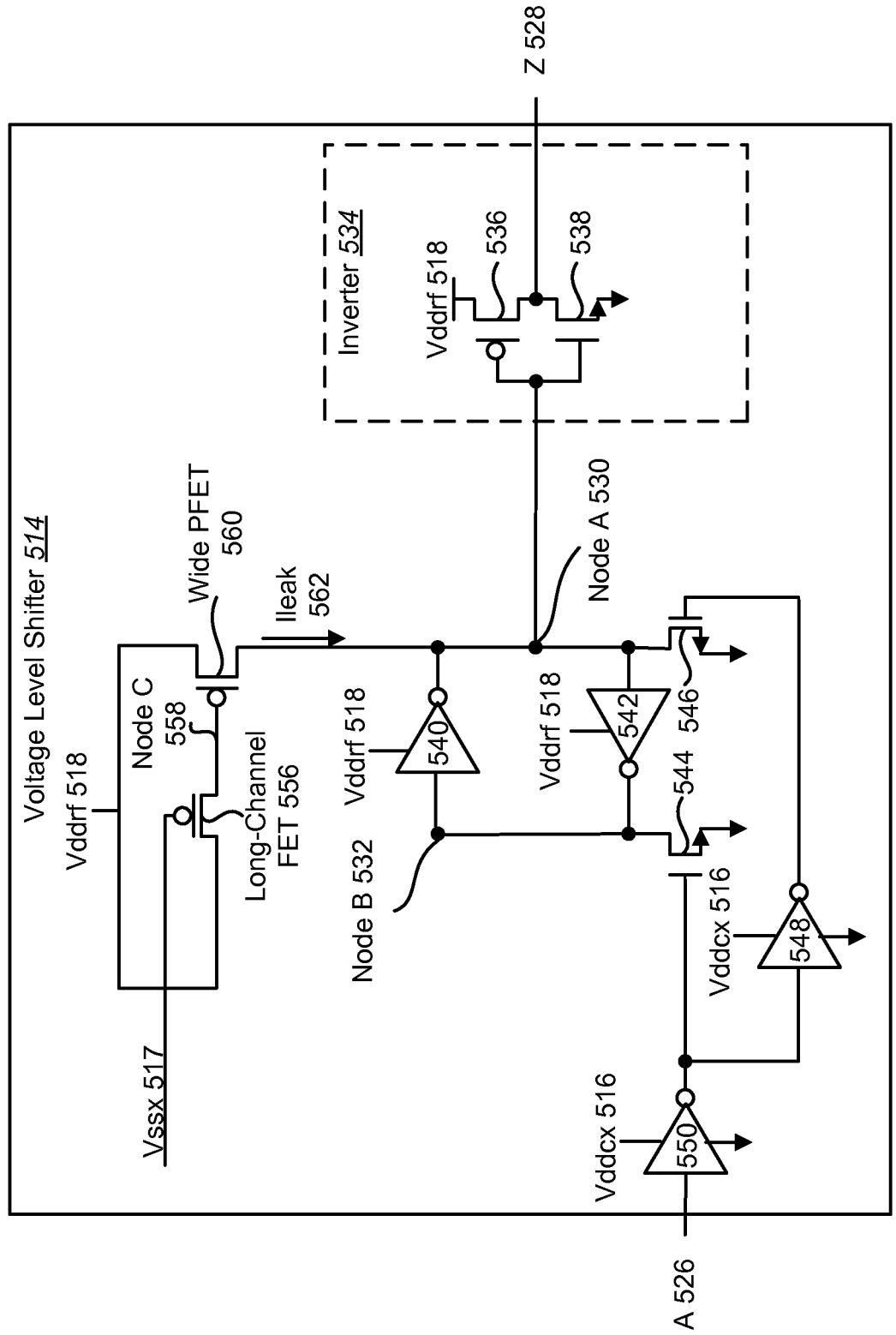

FIG. 5 is a circuit diagram of a voltage level shifter 514 for producing a predetermined output during slow ramping power on. The VLS 514 may include many of the same elements as before. In other words, the cross coupled inverters 540, 542, the inverter 534 with inverter transistors 536, 538, the secondary inverters 548, 550, and the secondary transistors 544, 546 illustrated in FIG. 5 may operate in the same manner as the cross coupled inverters 340, 342, the inverter 334 with inverter transistors 336, 338, the secondary inverters 348, 350 and the secondary transistors 344, 346 illustrated in FIG. 3, respectively.

The VLS 314 illustrated in FIG. 3 may operate particularly well to ensure that Z 328 is low during fast ramping power on, (i.e., less than about 200 microseconds). However, when Vddrf 518 ramps up slowly, (i.e., 200 microseconds or longer), using capacitive coupling may not work quite as well. Therefore, FIG. 5 illustrates a VLS 514 that uses leakage current 562 to charge Node A 530 to ensure that Z 528 is low during slow ramping power on. Together, the configurations in FIG. 3 and FIG. 5 may produce a predetermined output, Z 528, during slow or fast ramping power on.

During normal operation (both Vddrf 518 and Vddcx 516 are high), Z 528 may equal A 526. However, to produce a predetermined output during slow ramping power on, the VLS 514 may include a long-channel transistor 556 that acts as a resistance/capacitance (RC) delay element, although any suitable transistor may be used. The long-channel FET 556 may be initially in the sub-threshold region (Vddrf<300 mV). The long-channel FET 556 is in the "ON" state when Vddrf 518 has reached its final value. In other words, the long-channel transistor 556 may force the voltage at a Node C 558 to lag Vddrf 518 when operating in the sub-threshold region, i.e., when Vgs<threshold voltage (Vth). The delay between the rise in voltage at Node C 558 and Vddrf 518 may create a differential voltage between the gate and source of a wide P-channel field effect transistor (PFET) 560, although any suitable transistor may be used. The wide FET 560 may be initially in the sub-threshold region (Vddrf<300 mV). The wide PFET 560 is in the "OFF" state when Vddrf 518 has reached its final value. This differential voltage on the wide PFET 560, Vgs, may create leakage current, Ileak 562, when the wide PFET 560 is operating in the sub-threshold region. The leakage current, Ileak 562, may then charge Node A 530, which then forces Z 528 low. Node B 532 may hold the opposite logical value as Node A 530. This sub-threshold charge injection, therefore, ensures that Z 528 is low during slow ramping power on. As before, the ground voltage level may be a relative voltage level, e.g., Vssx 517. Using charge injection, the level shifter 514 may operate according to the following rules:

Vddrf=1; Vddcx=0:Z=0;
Vddrf=1; Vddcx=1:Z=A;

The present systems and methods may alternatively be used to ensure that Z 528 is high during slow ramping power on.

The width of a FET may determine the maximum current a transistor is able to carry. Therefore, a wide FET 560 may tolerate high current. The downside may be that a wider transistor may occupy larger silicon area. As used herein, the term "long channel" FET may refer to a transistor with a channel length greater than the minimum allowed by present technology, i.e., a FET with a channel length longer than the presently shortest possible channel length. In one configuration, the minimum channel length allowed by present technology for a particular thick oxide transistor is 0.28 micrometers. Therefore, a long channel thick oxide FET would be a thick oxide FET with a channel length longer than 0.28 micrometers. The term "wide channel" FET may refer to a transistor having a dimension greater or equal to 1 micrometer.

FIG. 6 is a flow diagram illustrating a method 600 for producing a predetermined output during slow ramping power on. The method 600 may be performed by the voltage level shifter 514 illustrated in FIG. 5. A power supply, (e.g., Vddrf 518), in a sequential circuit may ramp up 668 slowly, i.e., 200 microseconds or more. The output of a long channel FET that is operating in the sub-threshold region may be delayed 670 compared to the power supply. A differential voltage (Vgs) may be created 672 across a second FET using the delayed output of the long channel FET. Leakage current may then be created 674 with the second FET operating in the sub-threshold region using the differential voltage. An internal node may be charged 676 in the sequential circuit with the leakage current. The logical value on the internal node may then be inverted 678 to produce a control signal at a predetermined logical value. In other words, the leakage current, Ileak 562, from the wide PFET 560 may charge Node A 530 to a high value, which may be inverted by the inverter 534 to force Z 528 to low.

Figure 6A:
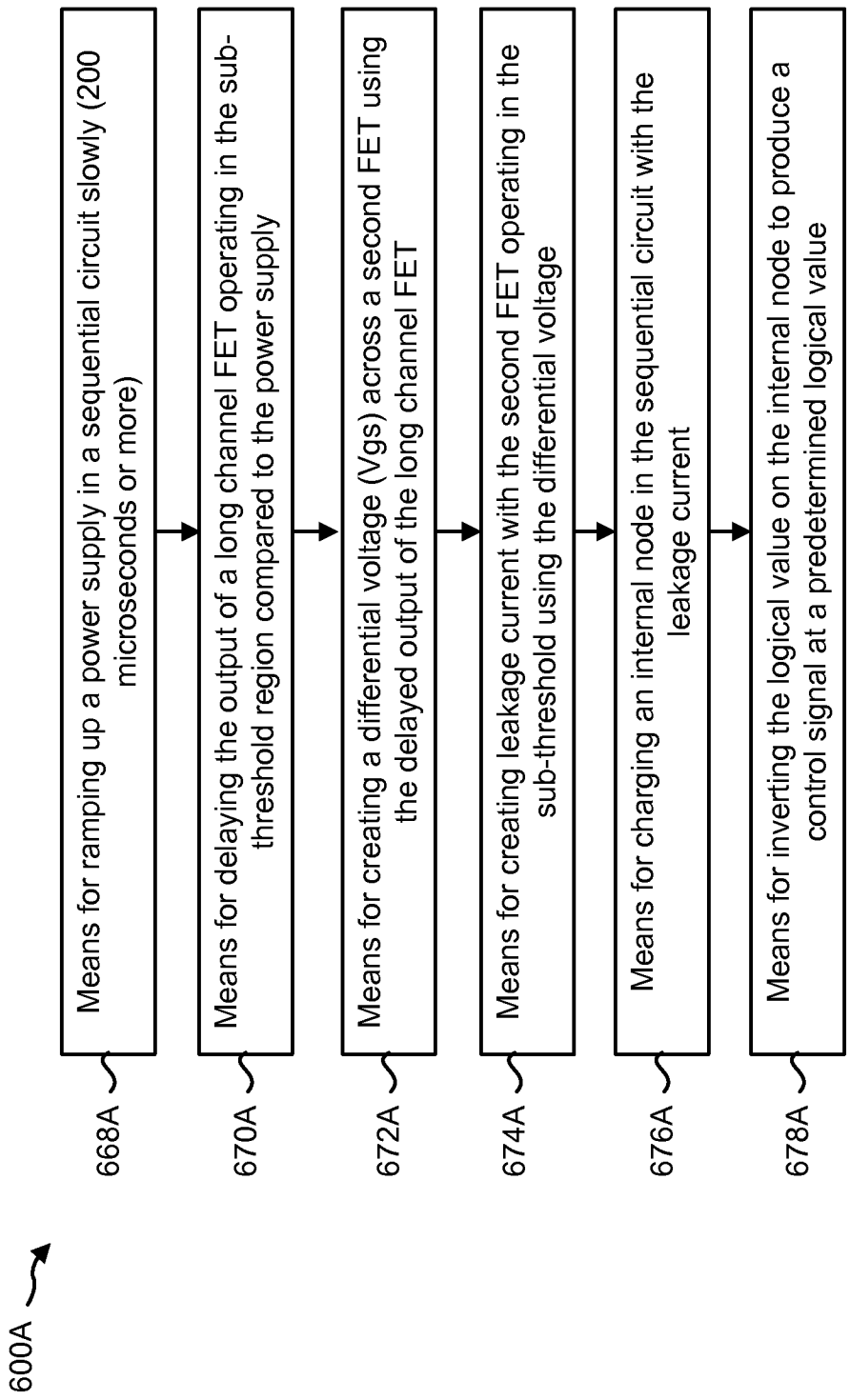
FIG. 6A illustrates means-plus-function blocks corresponding to the method of FIG. 6.

The method 600 of FIG. 6 described above may be performed by various hardware and/or software component(s) and/or module(s) corresponding to the means-plus-function blocks 600A illustrated in FIG. 6A. In other words, blocks 668 through 678 illustrated in FIG. 6 correspond to means-plus-function blocks 668A through 678A illustrated in FIG. 6A.

FIGS. 7A-7D are waveforms illustrating characteristics of the voltage level shifter 514 illustrated in FIG. 5 for producing a predetermined output during slow ramping power on. FIG. 7A illustrates a slow ramping power supply, Vddrf 718. In other words, Vddrf 718 takes 200 microseconds or longer to reach its "on" value of about 2.1 V, although other DC power values may be used for Vddrf 718, e.g., 1 V, 1.5 V, 2 V, etc. FIG. 7A also illustrates a delayed output of a long-channel PFET 556 operating in the sub-threshold region, i.e., Node C 758. FIG. 7B is an enlarged view of the area 780 in FIG. 7A. As shown in FIG. 7B, the voltage on Node C 758 rises slower than Vddrf 718 for a period of time, thus creating a delay. The VLS 514 takes advantage of the delay created by the long-channel PFET 556 by creating a potential difference, Vgs 782, across the gate and source of a wide PFET 560. This delay is shown between 50 microseconds and 100 microseconds.

FIG. 7C illustrates the differential voltage, Vgs 782, across the wide PFET. In other words, FIG. 7C illustrates the difference in voltage, Vgs 782, between Vddrf 718 and Node C 758 taken across the wide PFET 560. It may be desirable for a large Vgs 782 to create leakage current, Ileak 562.

FIG. 7D illustrates voltages at Node A 730 and Node B 732. Because of the cross coupled inverters 540, 542, when Node A 730 is high, Node B 732 is low. Similarly, when Node A 730 is low, Node B 732 is high. In the illustrated configuration, enhanced leakage current results in Node A 730 charging up during power up. Hence, output Z 528 starts off in the desired state.

Figure 8:
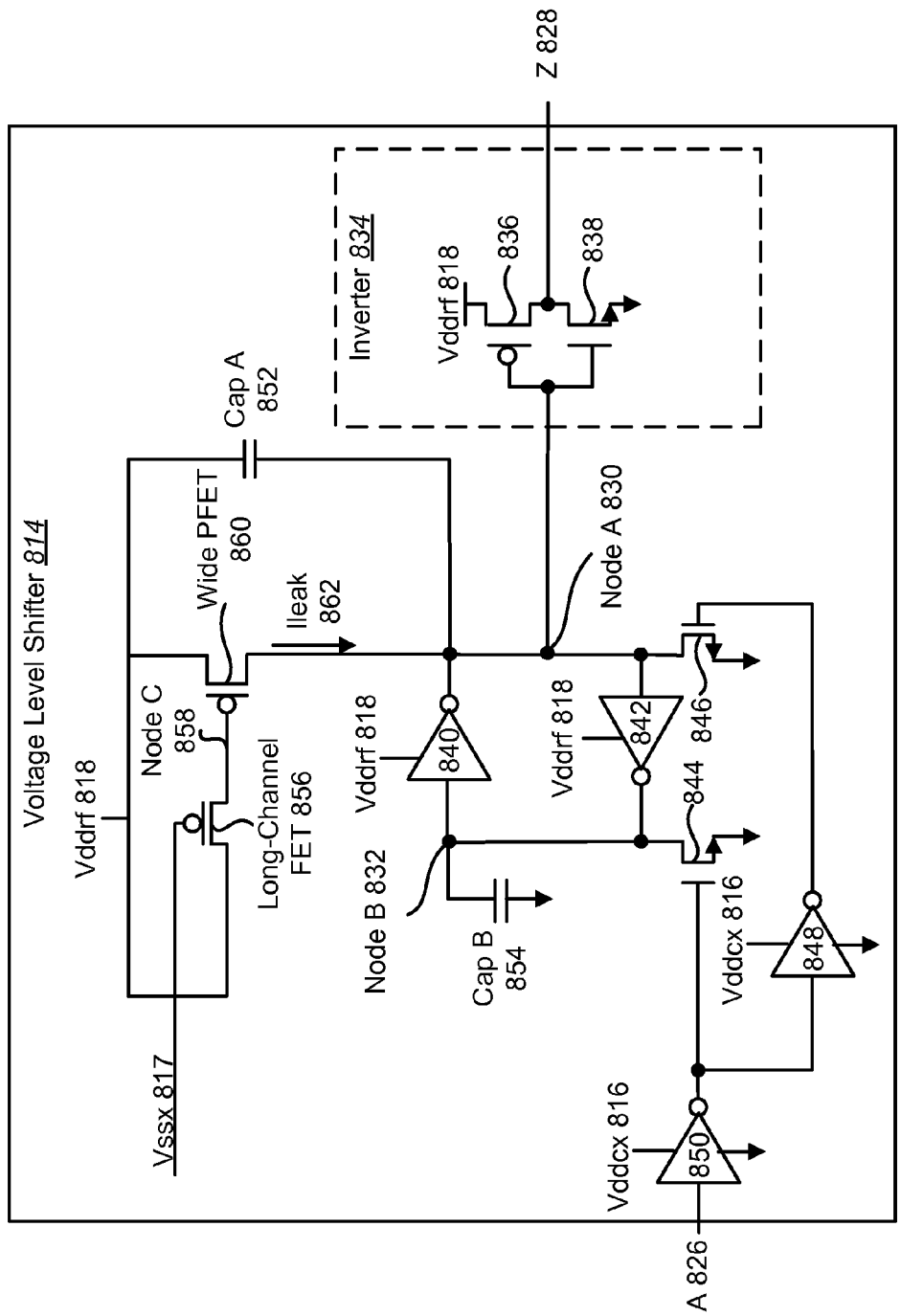

FIG. 8 is a circuit diagram illustrating a level shifter 814 for producing a predetermined output during power on. In other words, the level shifter 814 illustrated in FIG. 8 may combine the level shifter 314 illustrated in FIG. 3 and the level shifter 514 illustrated in FIG. 5 to enable a solution applicable for fast and slow supply ramps, e.g., 5-1,000 microseconds. The level shifter 814 may include many of the same elements as before. In other words, the cross coupled inverters 840, 842, the inverter 834 with inverter transistors 836, 838, the secondary inverters 848, 850, and the secondary transistors 844, 846 illustrated in FIG. 8 may operate in the same or similar manner as the cross coupled inverters 540, 542, the inverter 534 with inverter transistors 536, 538, the secondary inverters 548, 550 and the secondary transistors 544, 546 illustrated in FIG. 5, respectively.

As before, during normal operation, Z 828 equals A 826, i.e., A 826 is level shifted up (or down), but Z 828 will have the same logical value (high or low) as A 826. However, if Vddrf 818 is powered on before Vddcx 816, Z 828 may be unpredictable, which may inadvertently power on one or more circuit blocks, resulting in wasted power. Therefore, the level shifter 814 may use capacitive loading and charge injection to produce a predetermined logic value for Z 828 during power on.

During fast ramping power on, the level shifter 814 may use capacitive coupling to produce a predetermined output, Z 828, similar to the configuration illustrated in FIG. 3. Capacitor A 852 may be coupled between Vddrf 818 and Node A 830 and may ensure that once Vddrf 818 goes high, that Node A 830 also goes high. In response to Node A 830 going high, Z 828 may go low. Capacitor B 854 may be coupled between Node B 832 and ground and may ensure that Node B 832 is held low when Vddrf 818 ramps up. In other words, capacitor A 852 and capacitor B 854 ensure that Node A 830 and Node B 832 "wake up" at a predetermined value, i.e., capacitor A 852 and capacitor B 854 guard against metastability. Examples of capacitance values for capacitor A 852 and capacitor B 854 may be between 10 femtofarads (fF) and 15 fF, although any suitable capacitance values may be used.

During slow ramping power on, the level shifter 814 may use charge injection to produce a predetermined output, Z 828, similar to the configuration illustrated in FIG. 5. This may include a long-channel transistor 856 that acts as a resistance/capacitance (RC) delay element. In other words, the long-channel transistor 856 may force the voltage at a Node C 858 to lag Vddrf 818 when operating in the sub-threshold region, i.e., when Vgs<threshold voltage (Vth). The delay between the rise in voltage at Node C 858 and Vddrf 818 may create a differential voltage, Vgs, between the gate and source of a wide PFET 860. This differential voltage, Vgs, may create leakage current, Ileak 862, when the wide PFET 858 is operating in the sub-threshold region. The leakage current, Ileak 862 may then charge Node A 830, which then forces Z 828 low. This sub-threshold charge injection, therefore, ensures that Z 828 is low during slow ramping power on. Using capacitive coupling and charge injection, the level shifter 814 may operate according to the following rules:

Vddrf=1; Vddcx=0:Z=0;

Vddrf=1; Vddcx=1:Z=A;

As before, the ground voltage level used in the level shifter 814 may be a relative voltage level, e.g., Vssx 817. The VLS 814 may further operate according to the following specifications for core domain 202 to RF domain 204 shift up:

Frequency: 20 MHz;

Duty-cycle distortion: 40-60%;

Core voltage range: 1.16V-1.34V;

RF voltage range: 1.74V-2.27V;

Startup state: when RF domain 204 is powered on (and core domain 202 is off); Z=0;

Power down-up time of 100 ms (to ensure all internal capacitors are discharged), i.e., the level shifter 814 may need to wait at least 100 ms between powering off and powering on in order to allow capacitor A 852 and capacitor B 854 to discharge. In other words, the internal state nodes (Node A 830 and Node B 832) may need to be discharged before Vddrf 818 goes high. Therefore, a minimum down-up time of 100 ms may ensure that the level shifter 814 starts off in the right state. This minimum time may be enforced with software code;

Transition time range: 5 microseconds–200 microseconds (onetau value indicated): Vddrf(t)=Vddrf*[1−exp(−t/onetau)]; and when t=onetau; Vddrf(t)=Vddrf*0.63. The profile of the power domain ramping up may be exponential. For example, if a value of onetau is 100 us, then in 100 us Vddrf 818 reaches 63% of the final value, in 200 us Vddrf 818 reaches 86% of the final value and in 300 us Vddrf 818 reaches 95% of the final value. These percentage values may be obtained by evaluating [1−(1/2.718)]*100 and so on.

Although the area overhead of the level shifter 814 may be around 20%, some of the advantages of the level shifter 814 configuration illustrated in FIG. 8 may be:

the level shifter 814 operates over a wide power supply transition range (5 microseconds to 1,000 microseconds);

the level shifter 814 employs a long channel PFET 856 as a tunable resistor; and the level shifter 814 employs a wide PFET 860 for sub-threshold charge injection.

Figure 9:
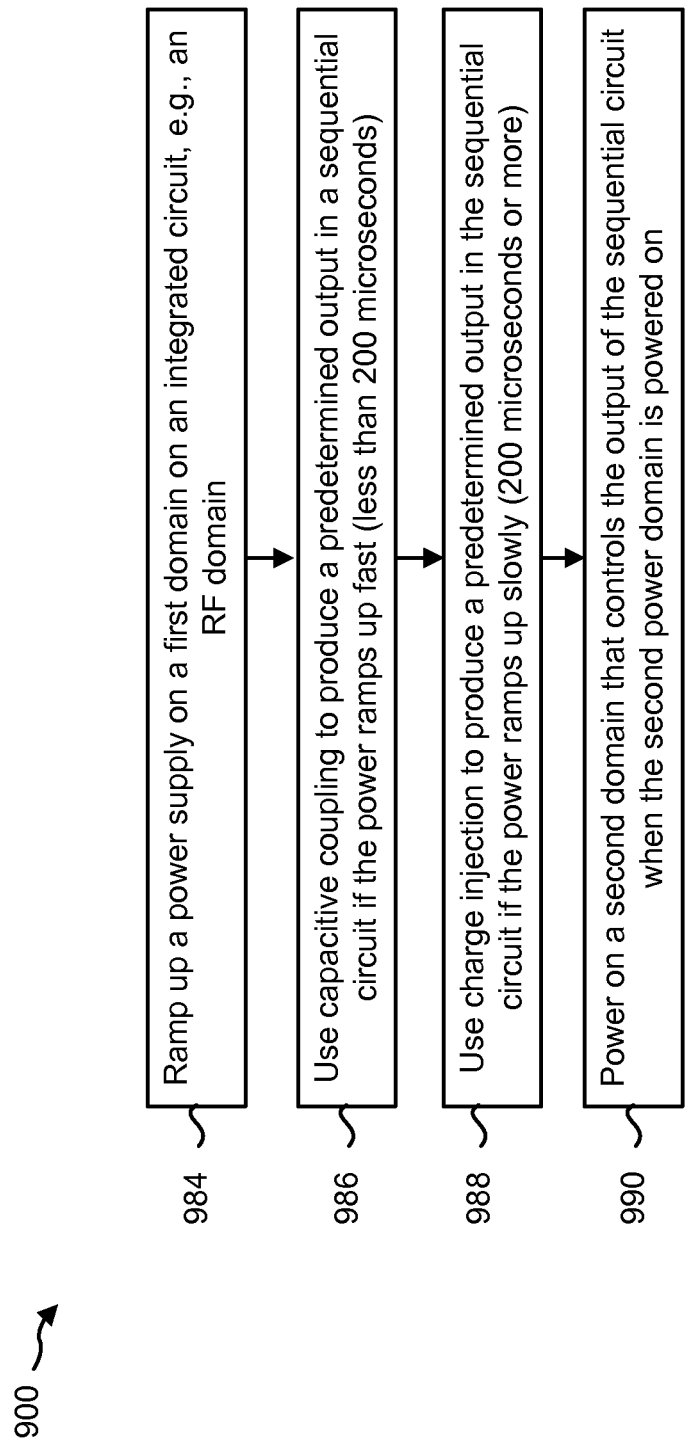

FIG. 9 is a flow diagram illustrating a method 900 for producing a predetermined output during power on. The method 900 may be performed by the level shifter 814 illustrated in FIG. 8, although the method 900 may also be used in any sequential circuit. A first domain on an integrated circuit may be powered on 984, e.g., Vddrf 818 may begin to ramp up. The level shifter 814 may use 986 capacitive coupling to produce a predetermined output if the power ramps up fast (less than 200 microseconds). In other words, capacitor A 852 may charge Node A 830 high, which may result in a low value on Z 828. However, the level shifter 814 may use 988 charge injection to produce a predetermined output if the power ramps up slowly (200 microseconds or more). In other words, a long-channel FET 856 may create a differential voltage, Vgs 782, across a wide PFET 860, which may result in leakage current, Ileak 862. The leakage current, Ileak 862, may then force Node A 830 high, which may result in a low Z 828. The level shifter 814 may power on 990 a second domain that controls the output of the sequential circuit when the second domain is powered on, e.g., a core domain 202 that controls the output of a level shifter 814.

Figure 9A:
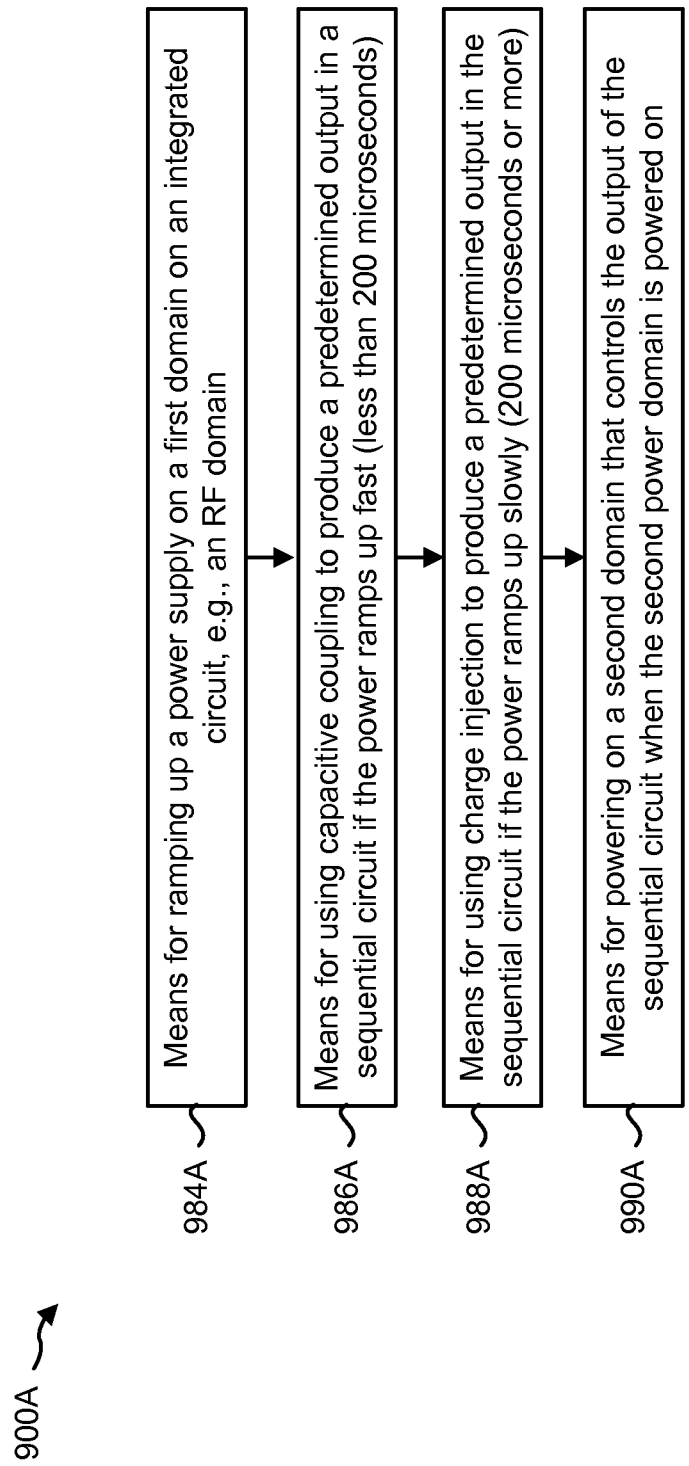
FIG. 9A illustrates means-plus-function blocks corresponding to the method of FIG. 9.

The method 900 of FIG. 9 described above may be performed by various hardware and/or software component(s) and/or module(s) corresponding to the means-plus-function blocks 900A illustrated in FIG. 9A. In other words, blocks 984 through 990 illustrated in FIG. 9 correspond to means-plus-function blocks 984A through 990A illustrated in FIG. 9A.

Figure 10:
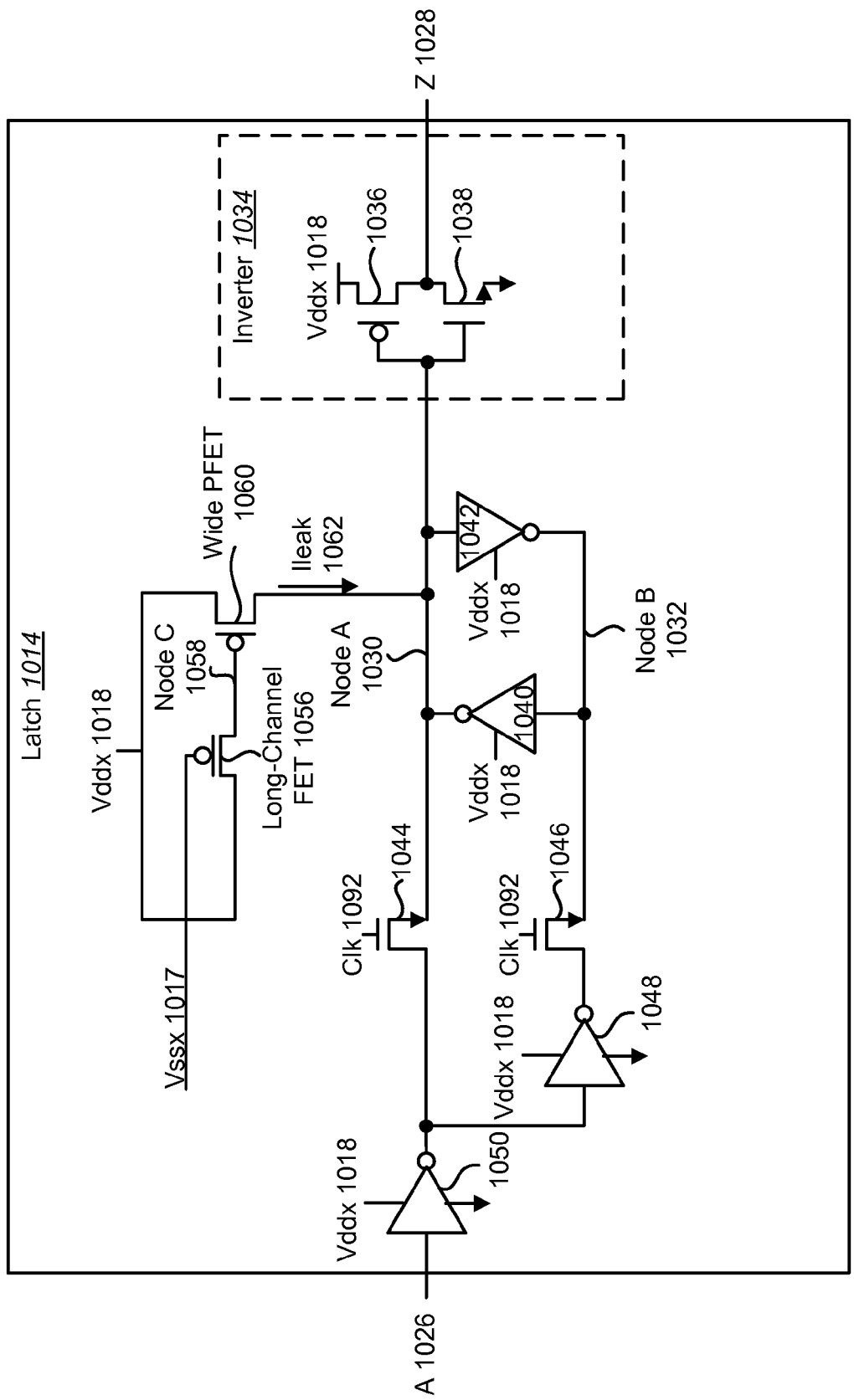
FIG. 10 is a circuit diagram of a latch for producing a predetermined output.

FIG. 10 is a circuit diagram of a latch 1014 for producing a predetermined output. The latch 1014 may use charge injection like the level shifter 514 in FIG. 5 and the level shifter 814 in FIG. 8. The latch 1014 may have only one power supply, Vddx 1018. The latch may include cross coupled inverters 1040, 1042 that store a logical value on Node A 1030 and the opposite logical value on Node B 1032. When Vddx 1018 is high, the first inverter 1050, second inverter 1048, first transistor 1044, and second transistor 1046 operate to set Node A 1030 equal to the opposite value of A 1026 during a high clock 1092 signal. This may force Z 1028 to equal A 1026, i.e., an inverter 1034 may use a series of transistors 1036, 1038 to force Z 1028 to the opposite logical value as Node A 1030. The case of a fast Vddx 1018 ramp may also be included in the latch 1014. This may include using coupling capacitors as described in the voltage level shifter 314 illustrated in FIG. 3.

However, if Vddx 1018 ramps up before the clock 1092 is turned on, it may be desirable to ensure that Z 1028 stays low. Therefore, the latch 1014 may include a long-channel transistor 1056 that acts as a resistance/capacitance (RC) delay element. In other words, the long-channel transistor 1056 may force the voltage at a Node C 1058 to lag Vddx 1018 when operating in the sub-threshold region, i.e., when Vgs<threshold voltage (Vth). The delay between the rise in voltage at Node C 1058 and Vddx 1018 may create a differential voltage between the gate and source of a wide PFET 1060. This differential voltage, Vgs, may create leakage current, Ileak 1062, when the wide PFET 1060 is operating in the sub-threshold region. In other words, the long-channel FET 1056 will ensure that the voltage on Node C 1058 lags Vddx 1018 (this is especially true in the sub-threshold region), which may result in enhanced leakage current, Ileak 1062. The leakage current, Ileak 1062, may then charge Node A 1030, which then forces Z 1028 low. This sub-threshold charge injection, therefore, ensures that Z 1028 is low. Using charge injection, the latch 1014 may operate according to the following rules:

Clock=0, as supply ramps up, Z=0;

Vddx=1; Clk=1:Z=A;

As before, the ground voltage level may be a relative voltage level, e.g., Vssx 1017.

Figure 11:
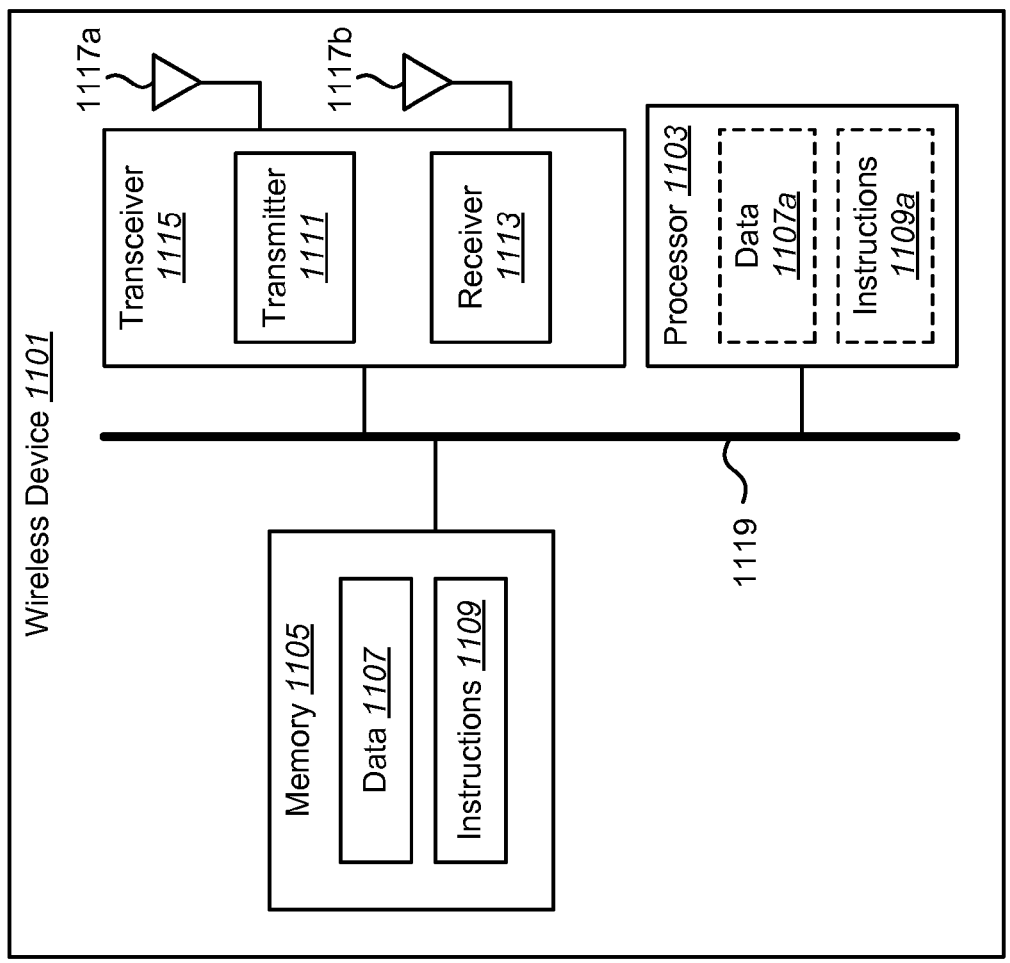
FIG. 11 illustrates certain components that may be included within a wireless device.

FIG. 11 illustrates certain components that may be included within a wireless device 1101. The wireless device 1101 may be a mobile device/station or a base station. Examples of mobile stations include cellular phones, handheld wireless devices, wireless modems, laptop computers, personal computers, etc. A mobile station may alternatively be referred to as an access terminal, a mobile terminal, a subscriber station, a remote station, a user terminal, a terminal, a subscriber unit, user equipment, etc. The present systems and methods may be used on an integrated circuit 106 that may be part of a wireless device 1101. Additionally, the present systems and methods may be used on an integrated circuit 106 that may be an electronic device that is not a wireless device 1101. However, the electronic device block diagram and components would be similar to the wireless device 1101 of FIG. 11 except that the electronic device may not have a transceiver 1115. There may be many power on circuits 114 in the processor 1103, memory 1105, and/or transceiver 1115, e.g., the memory 1105 may use one or more latches 1014 as illustrated in FIG. 10.

The wireless device 1101 includes a processor 1103. The processor 1103 may be a general purpose single- or multi-chip microprocessor (e.g., an ARM), a special purpose microprocessor (e.g., a digital signal processor (DSP)), a microcontroller, a programmable gate array, etc. The processor 1103 may be referred to as a central processing unit (CPU). Although just a single processor 1103 is shown in the wireless device 1101 of FIG. 11, in an alternative configuration, a combination of processors (e.g., an ARM and DSP) could be used.

The wireless device 1101 also includes memory 1105. The memory 1105 may be any electronic component capable of storing electronic information. The memory 1105 may be embodied as random access memory (RAM), read only memory (ROM), magnetic disk storage media, optical storage media, flash memory devices in RAM, on-board memory included with the processor, EPROM memory, EEPROM memory, registers, and so forth, including combinations thereof.

Data 1107 and instructions 1109 may be stored in the memory 1105. The instructions 1109 may be executable by the processor 1103 to implement the methods disclosed herein. Executing the instructions 1109 may involve the use of the data 1107 that is stored in the memory 1105. When the processor 1103 executes the instructions 1107, various portions of the instructions 1109a may be loaded onto the processor 1103, and various pieces of data 1107a may be loaded onto the processor 1103.

The wireless device 1101 may also include a transmitter 1111 and a receiver 1113 to allow transmission and reception of signals to and from the wireless device 1101. The transmitter 1111 and receiver 1113 may be collectively referred to as a transceiver 1115. An antenna 1117 may be electrically coupled to the transceiver 1115. The wireless device 1101 may also include (not shown) multiple transmitters, multiple receivers, multiple transceivers and/or multiple antenna (e.g., 1117a, 1117b).

The various components of the wireless device 1101 may be coupled together by one or more buses, which may include a power bus, a control signal bus, a status signal bus, a data bus, etc. For the sake of clarity, the various buses are illustrated in FIG. 15 as a bus system 1119.

The term "determining" encompasses a wide variety of actions and, therefore, "determining" can include calculating, computing, processing, deriving, investigating, looking up (e.g., looking up in a table, a database or another data structure), ascertaining and the like. Also, "determining" can include receiving (e.g., receiving information), accessing (e.g., accessing data in a memory) and the like. Also, "determining" can include resolving, selecting, choosing, establishing and the like.

The phrase "based on" does not mean "based only on," unless expressly specified otherwise. In other words, the phrase "based on" describes both "based only on" and "based at least on."

The term "processor" should be interpreted broadly to encompass a general purpose processor, a central processing unit (CPU), a microprocessor, a digital signal processor (DSP), a controller, a microcontroller, a state machine, and so forth. Under some circumstances, a "processor" may refer to an application specific integrated circuit (ASIC), a programmable logic device (PLD), a field programmable gate array (FPGA), etc. The term "processor" may refer to a combination of processing devices, e.g., a combination of a DSP and a microprocessor, a plurality of microprocessors, one or more microprocessors in conjunction with a DSP core, or any other such configuration.

The term "memory" should be interpreted broadly to encompass any electronic component capable of storing electronic information. The term memory may refer to various types of processor-readable media such as random access memory (RAM), read-only memory (ROM), non-volatile random access memory (NVRAM), programmable read-only memory (PROM), erasable programmable read only memory (EPROM), electrically erasable PROM (EEPROM), flash memory, magnetic or optical data storage, registers, etc. Memory is said to be in electronic communication with a processor if the processor can read information from and/or write information to the memory. Memory that is integral to a processor is in electronic communication with the processor.

The terms "instructions" and "code" should be interpreted broadly to include any type of computer-readable statement(s). For example, the terms "instructions" and "code" may refer to one or more programs, routines, sub-routines, functions, procedures, etc. "Instructions" and "code" may comprise a single computer-readable statement or many computer-readable statements.

The functions described herein may be implemented in hardware, software, firmware, or any combination thereof. If implemented in software, the functions may be stored as one or more instructions on a computer-readable medium. The terms "computer-readable medium" or "computer-program product" refers to any available medium that can be accessed by a computer. By way of example, and not limitation, a computer-readable medium may comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Disk and disc, as used herein, includes compact disc (CD), laser disc, optical disc, digital versatile disc (DVD), floppy disk and Blu-ray® disc where disks usually reproduce data magnetically, while discs reproduce data optically with lasers.

Software or instructions may also be transmitted over a transmission medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of transmission medium.

The methods disclosed herein comprise one or more steps or actions for achieving the described method. The method steps and/or actions may be interchanged with one another without departing from the scope of the claims. In other words, unless a specific order of steps or actions is required for proper operation of the method that is being described, the order and/or use of specific steps and/or actions may be modified without departing from the scope of the claims.

Further, it should be appreciated that modules and/or other appropriate means for performing the methods and techniques described herein, such as those illustrated by FIGS. 4, 6, and 9 can be downloaded and/or otherwise obtained by a device. For example, a device may be coupled to a server to facilitate the transfer of means for performing the methods described herein. Alternatively, various methods described herein can be provided via a storage means (e.g., random access memory (RAM), read only memory (ROM), a physical storage medium such as a compact disc (CD) or floppy disk, etc.), such that a device may obtain the various methods upon coupling or providing the storage means to the device. Moreover, any other suitable technique for providing the methods and techniques described herein to a device can be utilized.

It is to be understood that the claims are not limited to the precise configuration and components illustrated above. Various modifications, changes and variations may be made in the arrangement, operation and details of the systems, methods, and apparatus described herein without departing from the scope of the claims.

What is claimed is:

1. An integrated circuit configured for producing a predetermined output in a sequential circuit during power on, comprising:
   a power supply node;
   a first capacitor coupled to a first internal node and a second capacitor coupled to a second internal node, wherein the capacitors charge the internal nodes if a voltage at the power supply node ramps up to a set voltage at or faster than a period of time;
   a first transistor coupled to the power supply node, wherein the first transistor operates in a sub-threshold region and produces leakage current that charges the internal nodes when the voltage on the power supply node ramps up to the set voltage no faster than the period of time;
   an output node, wherein an output logical value on the output node is based on a logical value on the charged internal nodes when an input signal to the sequential circuit is not active and the voltage on the power supply node is at the set voltage; and
   two cross coupled inverters coupled to the first internal node and the second internal node, wherein the inverters maintain a first logical value on the first internal node and an opposite logical value on the second internal node.

2. The integrated circuit of claim 1, wherein the output logical value on the output node is equal to an input logical value in the input signal when the input signal is active.

3. The integrated circuit of claim 1, further comprising a second transistor configured to create a differential voltage on the first transistor, wherein the differential voltage causes the first transistor to create the leakage current.

4. The integrated circuit of claim 3, wherein the second transistor is a long-channel P-channel field effect transistor (PFET).

5. The integrated circuit of claim 1, wherein the set voltage is between 2 and 2.5 volts.

6. The integrated circuit of claim 1, wherein the period of time is 200 microseconds.

7. The integrated circuit of claim 1, further comprising an inverter coupled between the first internal node and the output node, wherein the inverter inverts the first logical value on the first internal node to produce the output logical value on the output node.

8. The integrated circuit of claim 1, wherein the first capacitor is coupled between the power supply node and the first internal node and the second capacitor is coupled between a relative ground and the second internal node.

9. A method for producing a predetermined output in a sequential circuit during power on, comprising:
   ramping up a power supply in a first domain;
   using capacitive coupling to produce a predetermined output if the power supply ramps up to a set voltage at or faster than a period of time;
   using charge injection to produce a predetermined output if the power supply ramps up to the set voltage no faster than the period of time, wherein the charge injection comprises creating leakage current with a first transistor operating in a sub-threshold region using a differential voltage;
   maintaining a first logical value on a first internal node and an opposite logical value on a second internal node using two cross coupled inverters coupled to the first internal node and the second internal node; and
   powering on a second power domain that controls the output of the sequential circuit when the second power domain is powered on.

10. The method of claim 9, wherein the capacitive coupling comprises:
    charging the first internal node via a capacitor using the power supply; and
    inverting the first logical value on the first internal node to produce a control signal at a predetermined logical value.

11. The method of claim 9, wherein the charge injection comprises:
    creating the differential voltage on the first transistor using a delayed output of a second transistor;
    charging the first internal node with the leakage current; and
    outputting an output logical value that is based on the first logical value on the first internal node when an input signal to the sequential circuit is not active and the power supply is at the set voltage.

12. The method of claim 9, wherein an output logical value is equal to an input logical value when an input signal is active.

13. The method of claim 11, wherein the second transistor is a long-channel P-channel field effect transistor (PFET).

14. The method of claim 9, wherein the set voltage is between 2 and 2.5 volts.

15. The method of claim 9, wherein the period of time is 200 microseconds.

16. The method of claim 11, further comprising inverting the first logical value on the first internal node to produce the output logical value.

17. An apparatus for producing a predetermined output in a sequential circuit during power on, comprising:
    means for ramping up a power supply in a first domain;
    means for using capacitive coupling to produce a predetermined output if the power supply ramps up to a set voltage at or faster than a period of time;
    means for using charge injection to produce a predetermined output if the power supply ramps up to the set voltage no faster than the period of time, wherein the means for using charge injection comprises means for creating leakage current with a first transistor operating in a sub-threshold region using a differential voltage;
    means for maintaining a first logical value on a first internal node and an opposite logical value on a second internal node using two cross coupled inverters coupled to the first internal node and the second internal node; and
    means for powering on a second power domain that controls the output of the sequential circuit when the second power domain is powered on.

18. The apparatus of claim 17, further comprising:
    means for charging the first internal node via a capacitor using the power supply; and
    means for inverting the first logical value on the first internal node to produce a control signal at a predetermined logical value.

19. The apparatus of claim 17, further comprising:
means for creating the differential voltage on the first transistor using a delayed output of a second transistor;
means for charging the first internal node with the leakage current; and
means for outputting an output logical value that is based on the first logical value on the first charged internal node when an input signal to the sequential circuit is not active and the power supply is at the set voltage.

20. The apparatus of claim 17, wherein an output logical value is equal to an input logical value when an input signal is active.

21. The apparatus of claim 19, wherein the second transistor is a long-channel P-channel field effect transistor (PFET).

22. The apparatus of claim 17, wherein the set voltage is between 2 and 2.5 volts.

23. The apparatus of claim 17, wherein the period of time is 200 microseconds.

24. The apparatus of claim 19, further comprising means for inverting the first logical value on the first internal node to produce the output logical value.

* * * * *